United States Patent
Tanaka

(10) Patent No.: US 6,581,195 B2
(45) Date of Patent: Jun. 17, 2003

(54) METHOD AND APPARATUS FOR EXTRACTING PARASITIC ELEMENT OF SEMICONDUCTOR CIRCUIT

(75) Inventor: Genichi Tanaka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 232 days.

(21) Appl. No.: 09/840,174

(22) Filed: Apr. 24, 2001

(65) Prior Publication Data

US 2002/0056070 A1 May 9, 2002

(30) Foreign Application Priority Data

Nov. 9, 2000 (JP) ........................................ 2000-342134

(51) Int. Cl.$^7$ ................................................. G06E 9/45
(52) U.S. Cl. ................................... 716/5; 716/8; 716/4
(58) Field of Search ............................... 716/4, 5, 2, 8, 716/9, 11, 12

(56) References Cited

U.S. PATENT DOCUMENTS

| | | | | |
|---|---|---|---|---|
| 6,243,653 B1 | * | 6/2001 | Findley .......................... | 702/65 |
| 6,253,357 B1 | * | 6/2001 | Takanashi ....................... | 716/5 |
| 6,363,516 B1 | * | 3/2002 | Cano et al. ..................... | 716/5 |
| 6,425,113 B1 | * | 7/2002 | Anderson et al. ............... | 716/5 |
| 6,436,807 B1 | * | 8/2002 | Cwynar et al. .................. | 438/619 |

FOREIGN PATENT DOCUMENTS

| | | |
|---|---|---|
| JP | 11-67918 | 3/1999 |
| JP | 11-204648 | 7/1999 |

* cited by examiner

Primary Examiner—Tom Thomas
Assistant Examiner—Douglas W. Owens
(74) Attorney, Agent, or Firm—Burns, Doane, Swecker & Mathis, LLP

(57) ABSTRACT

A reference degree of wire congestion relating to the arrangement of fill-metal (or dummy wire) is pre-set, a degree of wire congestion in each of wiring areas of a semiconductor circuit is calculated, the degree of wire congestion in each wiring area is compared with the reference degree of wire congestion, and it is judged that fill-metal is arranged in a specific wiring area of a low wire congestion. To consider an adverse influence of fill-metal arranged in the specific wiring area in the design of a layout of the semiconductor circuit, an insertion amount of the fill-metal is set according to a wire existence probability of the specific wiring area and a target wire existence probability pre-set, and a circuit layout of the specific wiring area is assumed on condition that the fill-metal having the insertion amount is arranged in the specific wiring area. Thereafter, information of parasitic elements such as wire capacitance and inductance is extracted from the layout of the semiconductor circuit in which the circuit layout of the specific wiring area assumed is included.

8 Claims, 4 Drawing Sheets

METHOD AND APPARATUS FOR EXTRACTING PARASITIC ELEMENT OF SEMICONDUCTOR CIRCUIT

BACKGROUND OF THE INVENTION

1. Field of the Invention

The present invention relates to a method and apparatus for extracting information of a parasitic element which is generated in automatic placement of devices and automatic routing of wires performed in the design of a semiconductor circuit, and more particularly to a parasitic element extracting apparatus and a parasitic element extracting method in which information of a parasitic element of a semiconductor circuit is extracted from a layout of a semiconductor circuit including a wiring area of a low wire congestion on the assumption that dummy wire (hereinafter, called fill-metal) is arranged in the wiring area in which it is expected to arrange the fill-metal to smoothly perform chemical mechanical polishing.

2. Description of Related Art

As semiconductor apparatuses develop in recent years, it is desired that devices of each semiconductor apparatus are more integrated in the high density. Therefore, it is required that wiring patterns are minutely formed in manufacturing processing. In general, when devices of a semiconductor apparatus are highly integrated in the high density, a multi-layered wiring structure is formed in the semiconductor apparatus. In this multi-layered wiring structure, a plurality of wiring layers separated from each other through insulation films are arranged on a substrate of the semiconductor apparatus, and wires are arranged on each wiring layer. Each wiring layer is minutely patterned with a pattern mask in an exposure step of the manufacturing processing to precisely arrange wires on the wiring layer. Therefore, in cases where the substrate surface, on which the pattern mask is arranged, is not flat because of unevenness of the substrate surface, resolution of the patterning in the exposure step is lowered, and there is a problem that each wiring layer cannot be minutely patterned.

To avoid this problem, the substrate surface is flattened by performing chemical mechanical polishing. This chemical mechanical polishing is generally performed to remove the global unevenness of the substrate surface. In the chemical mechanical polishing, a polishing material flows into a polishing cloth arranged on the substrate surface, and the substrate surface is polished by using the polishing cloth with the polishing material. When the multi-layered wiring structure is formed in a semiconductor apparatus, a lower wiring layer is flattened according to the chemical mechanical polishing, and the exposure step is performed to produce an upper wiring layer on the lower wiring layer. Therefore, wires can be minutely formed on each wiring layer.

However, when a difference in wire congestion between wiring areas of a wiring layer is large, it is difficult to precisely flatten the surface of the wiring layer according to the chemical mechanical polishing. Therefore, to reduce the difference in the wire congestion of the wiring layer, fill-metal denoting dummy wire is inserted in the wiring area of a low wire congestion so as to make degrees of wire congestion in the wiring areas of the wiring layer agree with each other. Here, the wire congestion (or the degree of wire congestion) is defined as a value which is obtained by dividing the number of wires required in a unit lattice of a layout of a semiconductor circuit, in which wiring is roughly performed, by the number of wires which are possible to be arranged in the unit lattice of the layout of the semiconductor circuit. For example, in cases where the unit lattice denotes a square in which each side has a length equal to ten times of a wiring pitch, the number of wires possible to be arranged in the unit lattice is equal to 100. Therefore, in cases where the number of wires required for each unit lattice is equal to 100, the wire congestion is 100%.

Also, each group of integrated devices of a semiconductor circuit, which is different from individual devices, is placed in a separated area and is surrounded by an insulation film to be electrically separated from other groups of integrated devices of the semiconductor circuit, and the integrated devices of the group are connected with each other by using wires formed in a film shape to produce a circuit of the devices. In this case, parasitic elements such as wiring capacitance (or parasitic capacitance) existing between wires and parasitic inductance are parasitically formed in the separation area and the filmed wires of the integrated circuit.

Therefore, to determine the performance of the semiconductor circuit in which the automatic placement of devices and the automatic routing of wires are performed in the design processing, it is required to consider an adverse influence of the parasitic elements generated in the semiconductor circuit.

FIG. 10 is a block diagram schematically showing the configuration of a conventional parasitic element extracting apparatus in which information of a parasitic element is extracted from a layout of the semiconductor circuit in which the automatic placement of devices and the automatic routing of wires are performed. In FIG. 10, 100 indicates layout information of a semiconductor circuit in which the automatic placement of devices and the automatic routing of wires are performed. 101 indicates a parasitic element extracting unit for extracting information of a parasitic element from the layout information 100 of the semiconductor circuit. The operation of the parasitic element extracting unit 101 is performed by executing a program, which is prepared from data used to determine the layout of the semiconductor circuit, in a computer. 102 indicates the information of the parasitic element extracted from the layout of the semiconductor circuit by the parasitic element extracting unit 101.

Next, an operation of the conventional parasitic element extracting apparatus is described.

When layout information 100 of the semiconductor circuit, in which the automatic placement of devices and the automatic routing of wires are performed, is received in the parasitic element extracting unit 101, data used to determine the layout of the semiconductor circuit is extracted from the layout information 100. Thereafter, positions of pins, routes of wires used to connect the pins with each other and positions of constituent elements (for example, layers and via holes) of the semiconductor circuit are determined according to the data, and a positional relationship of the constituent elements and sizes of the constituent elements are determined. Thereafter, in the parasitic element extracting unit 101, information 102 of parasitic capacitance and parasitic inductance accompanying each constituent element is extracted from the layout information 100 of the semiconductor circuit according to the positional relationship of the constituent elements and the sizes of the constituent elements.

Thereafter, the information 102 of each parasitic element extracted in the parasitic element extracting unit 101 is related to the constituent element accompanied by the parasitic element for each constituent element, and the information 102 of the parasitic elements related to each constituent element is output. The information 102 of the parasitic elements is used to determine the performance of the semiconductor circuit. Also, the information 102 of the parasitic elements is used to change the design of the semiconductor circuit so as to reduce an adverse influence of the parasitic elements.

Because the conventional parasitic element extracting apparatus has the above-described configuration, the information 102 of the parasitic elements can be extracted from the layout information 100 of the semiconductor circuit in which the automatic placement of devices and the automatic routing of wires are performed. However, because influence of fill-metal inserted in the semiconductor circuit in the manufacturing processing of the semiconductor circuit is not considered, there is a problem that an expected performance of the semiconductor circuit cannot be actually obtained because of a parasitic element generated between the fill-metal and a wire really arranged.

This problem is described more precisely below.

In cases where fill-metal denoting dummy wire is, for example, arranged in a wiring area of a low wire congestion in a wiring layer of a semiconductor circuit to flatten the surface of the wiring layer according to the chemical mechanical polishing, a value of capacitance (or a parasitic element) parasitically generated between wires adjacent to each other is increased, and a time delay in a wire really arranged is increased because of the parasitic element. Therefore, the semiconductor circuit cannot be operated at an expected speed.

As is described above, in cases where the fill-metal is inserted in the semiconductor circuit in addition to the arrangement of wires, the parasitic element expected according to the parasitic element information 102 considerably differs from a parasitic element actually generated in the semiconductor circuit, and there is a problem that an expected performance of the semiconductor circuit is not actually obtained.

SUMMARY OF THE INVENTION

An object of the present invention is to provide, with due consideration to the drawbacks of the conventional parasitic element extracting apparatus, a parasitic element extracting apparatus and a parasitic element extracting method in which an extraction precision of information of a parasitic element of a semiconductor circuit is improved in parasitic extraction by considering influence of fill-metal (or dummy wire) inserted in a wiring area of the semiconductor circuit in the designing of a layout of the semiconductor circuit. That is, the information of the parasitic element is extracted from a layout of the semiconductor circuit including a wiring area of a low wire congestion on the assumption that fill-metal is arranged in the wiring area in which the arrangement of the fill-metal is expected.

The object is achieved by the provision of a parasitic element extracting apparatus comprising wire congestion calculating means for calculating a degree of wire congestion in a wiring area, which is placed in a layout of a semiconductor circuit, according to both the number of wires arranged in the wiring area and the number of wires possible to be arranged in the wiring area, dummy wiring area judging means for pre-setting a reference degree of the wire congestion relating to the arrangement of dummy wire, and comparing the degree of the wire congestion in the wiring area of the semiconductor circuit calculated by the wire congestion calculating means with the reference degree of the wire congestion to judge whether or not dummy wire is arranged in the wiring area for which the degree of the wire congestion is calculated by the wire congestion calculating means, dummy wiring assuming means for setting an additional amount of the dummy wire according to the degree of the wire congestion in the wiring area of the semiconductor circuit calculated by the wire congestion calculating means in cases where it is judged by the dummy wiring area judging means that the dummy wire is arranged in the wiring area, and assuming a circuit layout of the wiring area on condition that the dummy wire, of which the additional amount is set, is arranged in the wiring area, and parasitic element extracting means for extracting information of a parasitic element of the semiconductor circuit from a layout of the semiconductor circuit in which the circuit layout of the wiring area assumed by the dummy wiring assuming means is included.

The object is also achieved by the provision of a parasitic element extracting method comprising a wire congestion calculating step for calculating a degree of wire congestion in a wiring area of a semiconductor circuit, according to both the number of wires arranged in the wiring area and the number of wires possible to be arranged in the wiring area, a dummy wiring area judging step for comparing the degree of the wire congestion calculated in the wire congestion calculating step with a reference degree of the wire congestion relating to the arrangement of dummy wire, and judging whether or not dummy wire is arranged in the wiring area for which the degree of the wire congestion is calculated in the wire congestion calculating step, a dummy wiring assuming step for setting an additional amount of the dummy wire according to the degree of the wire congestion in the wiring area calculated in the wire congestion calculating step in cases where it is judged in the dummy wiring area judging step that the dummy wire is arranged in the wiring area, and assuming a circuit layout of the wiring area on condition that the dummy wire, of which the additional amount is set, is arranged in the wiring area, and a parasitic element extracting step for extracting information of a parasitic element of the semiconductor circuit from a layout of the semiconductor circuit in which the circuit layout of the wiring area assumed in the dummy wiring assuming step is included.

Accordingly, because an adverse influence of the dummy wire inserted in the wiring area can be considered in advance when the automatic placement of devices and the automatic routing of wires are performed in the designing of a layout of the semiconductor circuit, the extraction precision of information of the parasitic element can be improved.

It is preferred that information of wire capacitance and/or inductance is extracted as the information of the parasitic element of the semiconductor circuit by the parasitic element extracting means, a value of the wire capacitance, of which the information is extracted from the layout of the semiconductor circuit, is set by the parasitic element extracting means to be higher than a value of the wire capacitance existing in the wiring area in which no dummy wire is arranged, and a value of the inductance, of which the information is extracted from the layout of the semiconductor circuit, is set by the parasitic element extracting means to be lower than a value of the inductance existing in the wiring area in which no dummy wire is arranged. Also, it is preferred that information of wire capacitance and/or inductance is extracted as the information of the parasitic element of the semiconductor circuit in the parasitic element extracting step, a value of the wire capacitance, of which the information is extracted from the layout of the semiconductor circuit, is set in the parasitic element extracting step to be higher than a value of the wire capacitance existing in the wiring area in which no dummy wire is arranged, and a value of the inductance, of which the information is extracted from the layout of the semiconductor circuit, is set in the parasitic element extracting step to be lower than a value of the inductance existing in the wiring area in which no dummy wire is arranged.

Accordingly, a difference between an estimated parasitic capacitance and/or inductance and a parasitic capacitance and/or inductance actually existing in the semiconductor circuit can be reduced.

It is preferred that a wire existence probability of the wiring area and a plurality of adjacent wire existence probabilities of wires of the wiring area are calculated by the dummy wiring assuming means according to both a wire existing region and a wiring possible region placed in the wiring area, the additional amount of the dummy wire depending on the degree of the wire congestion in the wiring area is set according to both the wire existence probability of the wiring area and a target wire existence probability of the wiring area pre-set by the dummy wiring assuming means, and the circuit layout of the wiring area is assumed by the dummy wiring assuming means so as to increase the adjacent wire existence probabilities of the wires of the wiring area at equal rates. Also, it is preferred that a wire existence probability of the wiring area and a plurality of adjacent wire existence probabilities of wires of the wiring area are calculated in the dummy wiring assuming step according to both a wire existing region and a wiring possible region placed in the wiring area, the additional amount of the dummy wire depending on the degree of the wire congestion in the wiring area is set according to both the wire existence probability of the wiring area and a target wire existence probability of the wiring area pre-set in the dummy wiring assuming step, and the circuit layout of the wiring area is assumed in the dummy wiring assuming step so as to increase the adjacent wire existence probabilities of the wires of the wiring area at equal rates.

Accordingly, an adverse influence of the dummy wire, which is inserted in the wiring area, can be considered in advance according to a simple assumption operation in the design of the integrated circuit.

It is preferred that a wire existence probability of the wiring area and a plurality of adjacent wire existence probabilities of wires of the wiring area are calculated by the dummy wiring assuming means according to both a wire existing region and a wiring possible region placed in the wiring area, the additional amount of the dummy wire depending on the degree of the wire congestion in the wiring area is set according to both the wire existence probability of the wiring area and a target wire existence probability of the wiring area pre-set by the dummy wiring assuming means, and the circuit layout of the wiring area is assumed by the dummy wiring assuming means so as to equally increase the adjacent wire existence probabilities of the wires of the wiring area to a fixed adjacent wire existence probability. Also, it is preferred that a wire existence probability of the wiring area and a plurality of adjacent wire existence probabilities of wires of the wiring area are calculated in the dummy wiring assuming step according to both a wire existing region and a wiring possible region placed in the wiring area, the additional amount of the dummy wire depending on the degree of the wire congestion in the wiring area is set according to both the wire existence probability of the wiring area and a target wire existence probability of the wiring area pre-set in the dummy wiring assuming step, and the circuit layout of the wiring area is assumed in the dummy wiring assuming step so as to equally increase the adjacent wire existence probabilities of the wires of the wiring area to a fixed adjacent wire existence probability.

Accordingly, an adverse influence of the dummy wire, which is inserted in the wiring area, can be considered in advance according to a simple assumption operation in the design of the integrated circuit.

DETAILED DESCRIPTION OF THE PREFERRED EMBODIMENTS

Embodiments of the present invention will now be described with reference to the accompanying drawings.
Embodiment 1

Figure 1:
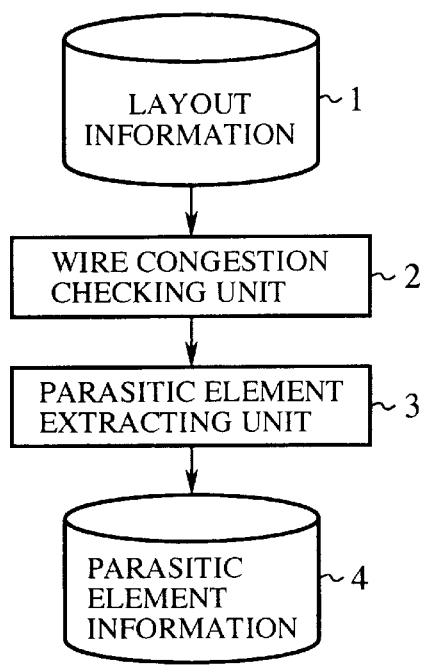
FIG. 1 is a block diagram showing the configuration of a parasitic element extracting apparatus, in which information of a parasitic element of a semiconductor circuit is extracted from a layout of a semiconductor circuit, according to a first embodiment of the present invention.

FIG. 1 is a block diagram showing the configuration of a parasitic element extracting apparatus, in which information of a parasitic element of a semiconductor circuit is extracted from a layout of a semiconductor circuit, according to a first embodiment of the present invention. In FIG. 1, 1 indicates layout information of a semiconductor circuit. The layout information 1 is obtained in a designing unit (not shown) in which the automatic placement of devices and the automatic routing of wires are performed for the semiconductor circuit. 2 indicates a wire congestion checking unit (or a wire congestion calculating means, a dummy wiring area judging means and a dummy wiring assuming means) for calculating degrees of wire congestion in a plurality of wiring areas of the semiconductor circuit according to the layout information 1 of the semiconductor circuit, selecting a specific wiring area, on which the insertion of fill-metal (or dummy wire) is judged, from the wiring areas according to the degrees of the wire congestion and assuming a circuit layout of the specific wiring area on condition that the fill-metal is inserted in the specific wiring area. In the wire congestion checking unit 2, a reference degree of the wire congestion is pre-set to judge according to the reference degree whether or not the insertion of the fill-metal is expected in each wiring area. More precisely, each of the degrees of the wire congestion in the wiring areas calculated according to the layout information 1 is compared with the reference degree of the wire congestion, and a specific wiring area of a low degree of the wire congestion, on which the insertion of fill-metal is judged, is selected from the wiring areas of the semiconductor circuit. 3 indicates a parasitic element extracting unit for extracting information of a parasitic element of the semiconductor circuit according to the parasitic extraction from a layout of the semiconductor circuit in which the circuit layout of the specific wiring area assumed in the wire congestion checking unit 2 is included. Here, the operation of the parasitic element extracting apparatus is programmed according to the first embodiment, and the wire congestion checking unit 2 and the parasitic element extracting unit 3 are operated by executing the program in a computer. 4 indicates the information of the parasitic element extracted from the semiconductor circuit in the parasitic element extracting unit 3.

Figure 2:
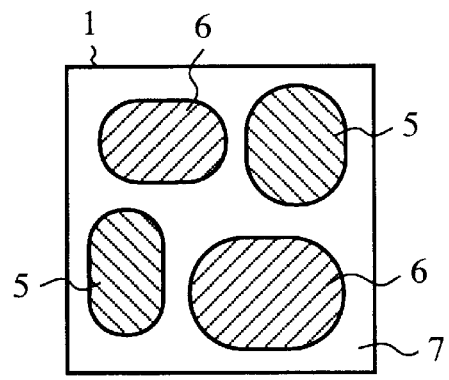
FIG. 2 is a view schematically showing a plurality of wiring areas in a layout of the semiconductor circuit according to the first embodiment.

FIG. 2 is a view schematically showing a plurality of wiring areas in a layout of the semiconductor circuit according to the first embodiment. In FIG. 2, 5 indicates a plurality of wiring areas of low wire congestion. 6 indicates a plurality of wiring areas of high wire congestion. 7 indicates the other wiring areas of middle wire congestion. The degree of the wire congestion is defined as a value which is obtained by dividing the number of wires, which are required for a unit lattice of a layout of the semiconductor circuit, by the number of wires possible to be arranged in the unit lattice. Also, the degree of the wire congestion equal to or lower than 50% is called low wire congestion, the degree of the wire congestion set to almost 80% is called middle wire congestion, and the degree of the wire congestion set to almost 100% is called high wire congestion. Also, a size of each wiring area 5, 6 or 7 is set so as to insert fill-metal in the wiring area. For example, a size of each wiring area 5, 6 or 7 is set to 100 $\mu$m×100 $\mu$m. Here, the constituent element of FIG. 2, which is the same as that of FIG. 1, is indicated by the same reference numeral as that of FIG. 1, and additional description of that constituent element is omitted.

Figure 3:
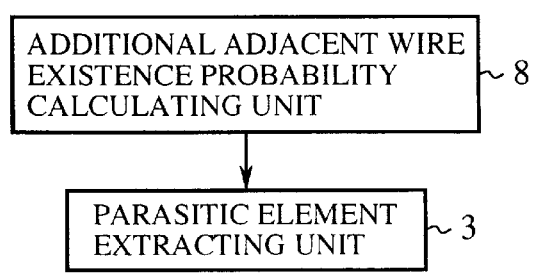
FIG. 3 is a block diagram showing an exemplified configuration of a wire congestion checking unit of the parasitic element extracting apparatus according to the first embodiment.

FIG. 3 is a block diagram showing an exemplified configuration of the wire congestion checking unit 2 of the parasitic element extracting apparatus according to the first embodiment. In FIG. 3, 8 indicates an additional adjacent wire existence probability calculating unit (or the dummy wiring assuming means) which is one of constituent elements of the wire congestion checking unit 2. In the additional adjacent wire existence probability calculating unit 8, a wire existing region and a wiring possible region are specified in a specific wiring area, on which the insertion of fill-metal is judged, according to the layout information 1 of the semiconductor circuit. A wire existence probability of the specific wiring area is calculated according to an area of the wire existing region and an area of the wiring possible region. A plurality of adjacent wire existence probabilities of the wires of the specific wiring area, which are increased by inserting fill-metal in the wiring area, are calculated according to the wire existence probability of the specific wiring area and a target wire existence probability pre-set in the additional adjacent wire existence probability calculating unit 8. A circuit layout of the specific wiring area, which is expected to be changed by the insertion of the fill-metal, is assumed according to the wires of the specific wiring area having the adjacent wire existence probabilities. Here, the constituent element of FIG. 3, which is the same as that of FIG. 1, is indicated by the same reference numeral as that of FIG. 1, and additional description of that constituent element is omitted.

An operation of the parasitic element extracting apparatus is described with reference to FIG. 4.

Figure 4:
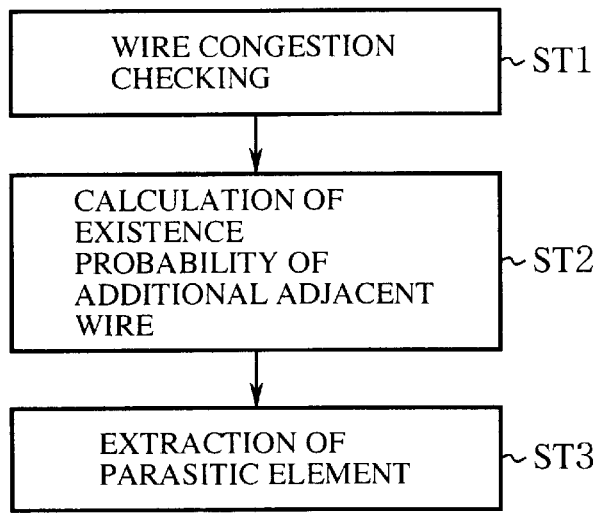
FIG. 4 is a flow chart showing an operation of the parasitic element extracting apparatus according to the first embodiment.

FIG. 4 is a flow chart showing an operation of the parasitic element extracting apparatus according to the first embodiment.

When layout information 1 of the semiconductor circuit is received in the wire congestion checking unit 2, a layout area of the semiconductor circuit indicated by the layout information 1 is divided into a plurality of wiring areas. The wiring areas have the same unit lattice size predetermined in the wire congestion checking unit 2. Thereafter, a degree of the wire congestion in each wiring area is calculated (wire congestion calculating step in a step ST1). The wiring areas are, for example, shown in FIG. 2. That is, the layout area of the semiconductor circuit is divided into the wiring areas 5 having the low wire congestion of 50% or less, the wiring areas 6 having the high wire congestion of almost 100%, and the other wiring areas 7 having the middle wire congestion of almost 80%.

Thereafter, the degree of the wire congestion in each wiring area 5, 6 or 7 is compared with the reference degree of the wire congestion pre-set in the wire congestion checking unit 2 to judge whether or not fill-metal is inserted in the wiring area 5, 6 or 7 (dummy wiring area judging step in the step ST1). In the first embodiment, the reference degree of the wire congestion is set to 60%, and it is judged to insert fill-metal in a wiring area in cases where the degree of the wire congestion in the wiring area is equal to or lower than the reference degree. Therefore, it is judged in the wire congestion checking unit 2 that fill-metal should be inserted in each of the wiring areas 5. The wire congestion calculating step and the dummy wiring area judging step correspond to the step ST1 shown in FIG. 4.

Thereafter, in the wire congestion checking unit 2, a circuit layout of each wiring area 5 is assumed on condition that fill-metal is inserted in the wiring area 5 on which the insertion of fill-metal is judged (dummy wiring assuming step in a step ST2).

In the first embodiment, a circuit layout of each wiring area 5, on which the insertion of fill-metal is judged, is determined in the additional adjacent wire existence probability calculating unit 8 of the wire congestion checking unit 2 on the assumption that fill-metal is inserted in the wiring area 5. More precisely, a wire existing region and a wiring possible region are specified in the wiring area 5, and a wire existence probability of the wiring area 5 is calculated by dividing an area of the wire existing region by an area of the wiring possible region. Also, a probability that a wire exists in a position adjacent to a designated wire is defined as an adjacent wire existence probability of the designated wire, and an adjacent wire existence probability of the designated wire is calculated. Therefore, assuming that fill-metal is inserted in the wiring area 5, the wire existence probability of the wiring area 5 is increased, and the adjacent wire existence probability of the designated wire existing in the wiring area 5 is increased. Thereafter, in the additional adjacent wire existence probability calculating unit 8, the fill-metal, which is judged to be inserted in the wiring area 5, is inserted in the wiring area 5 so as to increase each of adjacent wire existence probabilities of the wires existing in the wiring area 5 at equal rates, and a circuit layout of the wiring area 5 is assumed on condition that the fill-metal is inserted in the wiring area 5.

For example, it is assumed that wires having the same wire width are arranged in the wiring area 5 in equal intervals, the wire existence probability in the wiring area 5 is set to 10%, and an adjacent wire existence probability of a designated wire is set to 20%. In cases where it is pre-set in the additional adjacent wire existence probability calculating unit 8 that the wire existence probability of the wiring area 5 is increased to a target wire existence probability pre-set to 40% by inserting fill-metal in the wiring area 5, it is estimated in the additional adjacent wire existence probability calculating unit 8 that the adjacent wire existence probability of the designated wire reaching after the insertion of the fill-metal is, for example, equivalent to 80%. Therefore, it is judged in the additional adjacent wire existence probability calculating unit 8 that fill-metal is inserted in the wiring area 5 to increase adjacent wire existence probabilities of the wires of the wiring area 5 by three times ((80%−20%)/20%).

Also, in cases where there is a designated wire which has no adjacent wire at a position adjacent to the designated wire, a virtual wire segment is added to the position adjacent to the designated wire. That is, because the adjacent wire existence probability of the designated wire is increased by 60% (80%−20%) when the fill-metal is inserted in the wiring area 5, a virtual wire segment, of which a length is 3/5 of a length of the designated wire, is added to the position adjacent to the designated wire as an adjacent wire. Thereafter, the circuit layout of the wiring area 5 is assumed on condition that the fill-metal is inserted in the wiring area 5.

Figure 5:
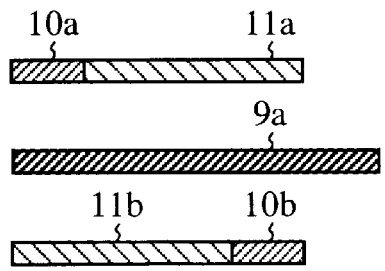
FIG. 5 is a view describing the assumption of a circuit layout of a wiring area performed in the parasitic element extracting apparatus according to the first embodiment on condition that fill-metal is inserted in the wiring area of the semiconductor circuit.
Figure 5:
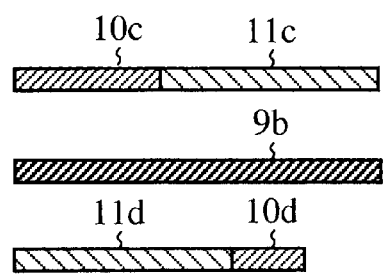

The assumption of the circuit layout of the wiring area 5 is described more precisely with reference to FIG. 5.

FIG. 5 is a view describing the assumption of a circuit layout of the wiring area 5 performed in the parasitic element extracting apparatus according to the first embodiment on condition that the fill-metal is inserted in the wiring area 5 of the semiconductor circuit. In FIG. 5, 9a and 9b indicate a plurality of designated wires which are used to calculate adjacent wire existence probabilities in the wiring area 5. In cases where no fill-metal is inserted in the wiring area 5, the designated wire 9a has an adjacent wire 10a, of which a length is equal to 1/5 of a length of the designated wire 9a, and another adjacent wire 10b of which a length is equal to 1/5 of the length of the designated wire 9a. Therefore, an adjacent wire existence probability of the designated wire 9a is equal to 20%. Also, the designated wire 9b has an adjacent wire 10c, of which a length is equal to 2/5 of a length of the designated wire 9b, and another adjacent wire 10d of which a length is equal to 1/5 of the length of the designated wire 9b. Therefore, an adjacent wire existence probability of the designated wire 9b is equal to 30%. 11a, 11b, 11c and 11d indicate virtual wire segments of fill-metal added to the wires 10a to 10d respectively to increase the adjacent wire existence probabilities of the designated wires 9a and 9b by inserting fill-metal in the wiring area 5. The wires 9a, 9b, 10a to 10d and 11a to 11d have the same wire width. Also, the wire 9a, the combination of the wires 10a and 11a and the combination of the wires 10b and 11b are arranged in equal intervals, and the wire 9b, the combination of the wires 10c and 11c and the combination of the wires 10d and 11d are arranged in the equal intervals.

For example, in the additional adjacent wire existence probability calculating unit 8, an insertion amount of fill-metal (or an additional amount of dummy wire) depending on the degree of the wire congestion in the wire area 5 is set according to both the wire existence probability of the wire area 5 and the target wire existence probability pre-set in the additional adjacent wire existence probability calculating unit 8. Thereafter, the adjacent wire existence probability of the designated wire 9a is, for example, increased from 20% to an equivalent adjacent wire existence probability of 80% by inserting the fill-metal of which the insertion amount is set in the additional adjacent wire existence probability calculating unit 8. In this case, as shown in FIG. 5, the virtual wire segment 11a, of which a length is equal to 3/5 of the length of the designated wire 9a, is added to the adjacent wire 10a as fill-metal, and the virtual wire segment 11b, of which a length is equal to 3/5 of the length of the designated wire 9a, is added to the adjacent wire 10b as fill-metal. That is, the virtual wire segments 11a and 11b, of which the lengths are three times of the lengths of the adjacent wires 10a and 10b, are added to the adjacent wires 10a and 10b. Therefore, prolonged lengths of the adjacent wires 10a and 10b obtained by assuming the insertion of the fill-metal respectively reach 4/5 of the length of the designated wire 9a, and the adjacent wire existence probability of the designated wire 9a is increased to 80%.

Also, because adjacent wire existence probabilities of the wires existing in the wiring area 5 are increased at equal rates in the additional adjacent wire existence probability calculating unit 8, it is tried that the virtual wire segment 11c, of which the length is three times of the length of the adjacent wire 10c, is added to the adjacent wire 10c, and the virtual wire segment 11d, of which the length is three times of the length of the adjacent wire 10d, is added to the adjacent wire 10d. Therefore, a prolonged length of the adjacent wire 10c obtained by assuming the addition of the fill-metal reaches 8/5 of the length of the designated wire 9b, and a prolonged length of the adjacent wire 10d obtained by assuming the addition of the fill-metal reaches 4/5 of the length of the designated wire 9b. In this case, the adjacent wire existence probability of the designated wire 9b is increased to 120%. Because the adjacent wire existence probability higher than 100% is nonsense, the prolonged length of the adjacent wire 10c is shortened not to make the adjacent wire existence probability of the designated wire 9b exceed 100%. Therefore, in the example shown in FIG. 5, the sum of the length of the wire 10c and the length of the virtual wire segment 11c is set to be equal to the length of the designated wire 9b.

Therefore, the circuit layout of the wiring area 5 can be assumed on condition that the fill-metal is inserted in the wiring area 5.

Thereafter, in the parasitic element extracting unit 3, information 4 of a parasitic element or a plurality of parasitic elements is extracted from a layout of the semiconductor circuit in which the circuit layout of the wiring area 5 assumed in the wire congestion checking unit 2 is included (parasitic element extracting step in a step ST3). In this case, the information 4 of the parasitic elements is extracted from the layout of the semiconductor circuit including the wiring area 5 on condition that the fill-metal is inserted in the wiring area 5. For example, in cases where information of wiring capacitance is extracted as information of parasitic elements, positions of pins in the wiring area 5, routes of wires used to connect the pins with each other and positions of constituent elements (for example, layers and via holes) of the semiconductor circuit are determined in the parasitic element extracting unit 3 according to a layout of the semiconductor circuit including the circuit layout of the wiring area 5 in which the fill-metal is inserted in the step ST2. Thereafter, information of the parasitic capacitance accompanying each constituent element is extracted from a layout of the semiconductor circuit including the wiring area 5 as information of parasitic elements according to the positional relationship of the constituent elements and the sizes of the constituent elements. In this case, when the fill-metal is inserted in the wiring area 5, a value of the parasitic capacitance actually existing in the semiconductor circuit becomes higher than that of the parasitic capacitance determined according to the layout information 1 of the semiconductor circuit. Therefore, a value of the parasitic capacitance, of which the information is extracted, is higher than that of the parasitic capacitance existing in the semiconductor circuit in which no fill metal is inserted.

Also, in cases where information of parasitic inductance is extracted as information of parasitic elements, positions of pins in the wiring area 5, routes of wires used to connect the pins with each other and positions of constituent elements (for example, layers and via holes) of the semiconductor circuit are determined in the parasitic element extracting unit 3 according to a layout of the semiconductor circuit including the circuit layout of the wiring area 5 in which the fill-metal is inserted in the step ST2. Thereafter, a return bus is assumed, and information of the parasitic inductance is extracted from a layout of the semiconductor circuit including the circuit layout of the wiring area 5 as information of parasitic elements. In this case, when the fill-metal is inserted in the wiring area 5, a value of the parasitic inductance actually existing in the semiconductor circuit becomes lower than that of the parasitic inductance determined according to the layout information 1 of the semiconductor circuit. Therefore, a value of the parasitic inductance, of which the information is extracted, is lower than that of the parasitic capacitance existing in the semiconductor circuit in which no fill metal is inserted.

Thereafter, the information 4 of each parasitic element extracted in the parasitic element extracting unit 3 is related to one constituent element of the semiconductor circuit accompanied by the parasitic element and is output. The parasitic element information 4 is used to determine the performance of the semiconductor circuit which has the layout indicated by the layout information 1. Also, the parasitic element information 4 is used to change the design of the semiconductor circuit so as to reduce an adverse influence of the parasitic elements generated in the semiconductor circuit.

As is described above, in the first embodiment, information of parasitic elements is extracted from the semiconductor circuit including the wiring area 5 of the low wire congestion, in which the arrangement of fill-metal is expected, on the assumption that the fill-metal is arranged in the wiring area 5. Accordingly, because an adverse influence of the fill-metal inserted in the wiring area 5 can be considered in advance when the automatic placement of devices and the automatic routing of wires are performed in the design of a layout of the semiconductor circuit, the extraction precision of the information of the parasitic elements can be improved.

Also, in the first embodiment, information of parasitic capacitance and/or parasitic inductance is extracted as information of parasitic elements from the semiconductor circuit according to a layout of the semiconductor circuit including the circuit layout of the wiring area 5 in which the fill-metal is inserted, a value of the parasitic capacitance is higher than that of the parasitic capacitance existing in the semiconductor circuit in which no fill metal is inserted, and a value of the parasitic inductance is lower than that of the parasitic inductance existing in the semiconductor circuit in which no fill metal is inserted. Accordingly, a difference between the parasitic capacitance and/or inductance estimated in the parasitic element extracting apparatus and parasitic capacitance and/or inductance actually existing in the semiconductor circuit can be reduced.

In addition, in the first embodiment, a wiring area 5 or a plurality of wiring areas 5, on which the insertion of fill-metal is judged, are selected according to the degree of the wire congestion in the wiring area 5 or the degrees of the wire congestion in the wiring areas 5, an insertion amount of fill-metal (or an additional amount of dummy wire) depending on the degree of the wire congestion in each wire area 5, is set according to both the wire existence probability of the wire area 5 and the target wire existence probability pre-set in the additional adjacent wire existence probability calculating unit 8, and a circuit layout of the wiring area 5, in which the wire existence probability of the wiring area is increased to the target wire existence probability and the adjacent wire existence probabilities of the wires of the wiring area 5 are increased at equal rates, is assumed on condition that the insertion amount of fill-metal is inserted in the wiring area 5. Accordingly, an adverse influence of the fill-metal, which is inserted in the wiring area 5, can be considered in advance according to a simple assumption operation in the design of the integrated circuit.

Embodiment 2

Figure 6:
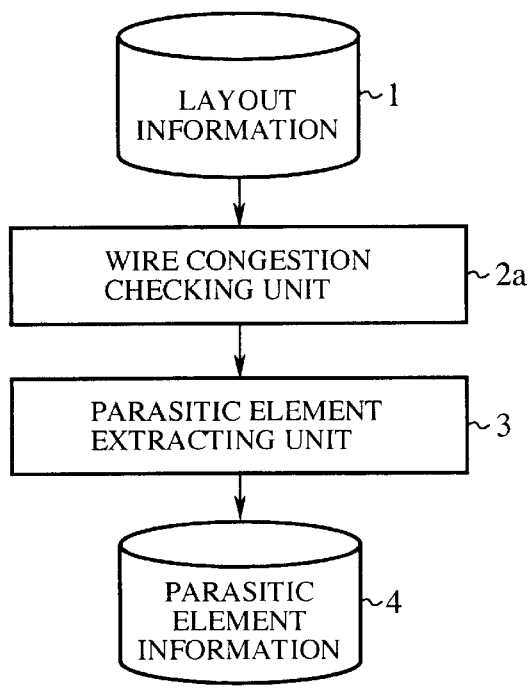
FIG. 6 is a block diagram showing the configuration of a parasitic element extracting apparatus, in which information of a parasitic element of a semiconductor circuit is extracted from a layout of a semiconductor circuit, according to a second embodiment of the present invention.

FIG. 6 is a block diagram showing the configuration of a parasitic element extracting apparatus, in which information of a parasitic element of a semiconductor circuit is extracted from a layout of a semiconductor circuit, according to a second embodiment of the present invention. In FIG. 6, 2a indicates a wire congestion checking unit (or a wire congestion calculating means, a dummy wiring area judging means and a dummy wiring assuming means) for calculating degrees of the wire congestion in a plurality of wiring areas of the semiconductor circuit according to the layout information 1 of the semiconductor circuit, selecting a specific wiring area, on which the insertion of fill-metal is judged, from the wiring areas according to the degrees of the wire congestion and assuming a circuit layout of the specific wiring area on condition that fill-metal (or dummy wire) is inserted in the specific wiring area. The wire congestion checking unit 2a has an additional adjacent wire existence probability calculating unit 8a described later. In the wire congestion checking unit 2a, a reference degree of the wire congestion is pre-set in the same manner as in the first embodiment to judge according to the reference degree of the wire congestion whether or not it is expected to insert fill-metal in a wiring area. More precisely, each of the degrees of the wire congestion in the wiring areas of the semiconductor circuit is calculated according to the layout information 1 of the semiconductor circuit and is compared with the reference degree of the wire congestion, and a specific wiring area or a plurality of specific wire areas, on which the insertion of fill-metal is judged, are selected from the wiring areas of the semiconductor circuit. Here, the constituent elements of FIG. 6, which are the same as those of FIG. 1, are indicated by the same reference numerals as those of FIG. 1, and additional description of those constituent elements is omitted.

Figure 7:
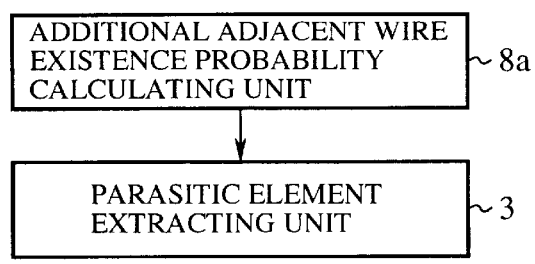
FIG. 7 is a block diagram showing an exemplified configuration of a wire congestion checking unit of the parasitic element extracting apparatus according to the second embodiment.

FIG. 7 is a block diagram showing an exemplified configuration of the wire congestion checking unit 2a of the parasitic element extracting apparatus according to the second embodiment. In FIG. 7, 8a indicates an additional adjacent wire existence probability calculating unit (or the dummy wiring assuming means) which is one of constituent elements of the wire congestion checking unit 2a. In the additional adjacent wire existence probability calculating unit 8a, a wire existing region and a wiring possible region are specified in a wiring area on which the insertion of fill-metal is judged, a wire existence probability of the wiring area is calculated according to the wire existing region and the wiring possible region, a plurality of adjacent wire existence probabilities of the wires of the wiring area are calculated according to the wire existence probability of the wiring area and a target wire existence probability pre-set in the additional adjacent wire existence probability calculating unit 8a, and a circuit layout of the wiring area, which is expected to be changed by the insertion of the fill-metal, is assumed according to the adjacent wire existence probabilities. Here, the constituent element of FIG. 7, which is the same as that of FIG. 6, is indicated by the same reference numeral as that of FIG. 6, and additional description of that constituent element is omitted.

An operation of the parasitic element extracting apparatus is described with reference to FIG. 8.

Figure 8:
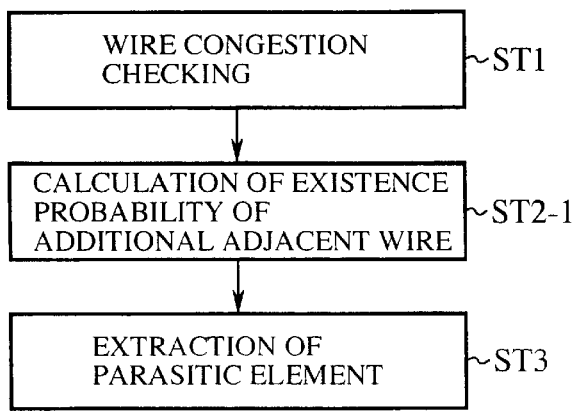
FIG. 8 is a flow chart showing an operation of the parasitic element extracting apparatus according to the second embodiment.

FIG. 8 is a flow chart showing an operation of the parasitic element extracting apparatus according to the second embodiment.

The wire congestion checking operation is performed in the step ST1 in the same manner as in the first embodiment, so that duplicated description of the wire congestion checking operation is omitted. In the parasitic element extracting apparatus according to the second embodiment, an operation for assuming a circuit layout of a wiring area of low wire congestion, on which the insertion of fill-metal is judged, differs from that in the first embodiment. Therefore, an operation for assuming a circuit layout of the wiring area 5 of the low wire congestion, on condition that fill-metal is inserted in the wiring area 5, is described.

In the second embodiment, a circuit layout of each wiring area 5, on which the insertion of fill-metal is judged, is determined in the additional adjacent wire existence probability calculating unit 8a of the wire congestion checking unit 2a on the assumption that fill-metal is inserted in the wiring area 5. More precisely, a wire existing region and a wiring possible region are specified in the wiring area 5, and a wire existence probability of the wiring area 5 is calculated by dividing an area of the wire existing region by an area of the wiring possible region. Also, a probability that a wire exists in a position adjacent to a designated wire is defined as an adjacent wire existence probability of the designated wire, and an adjacent wire existence probability of a designated wire is calculated.

Thereafter, in the additional adjacent wire existence probability calculating unit 8a, an insertion amount of fill-metal (or an additional amount of dummy wire) depending on the degree of the wire congestion in the wire area 5, is set according to both the wire existence probability of the wire area 5 and the target wire existence probability pre-set in the additional adjacent wire existence probability calculating unit 8a. Thereafter, the fill-metal, of which the insertion amount is set in the additional adjacent wire existence probability calculating unit 8a, is inserted in the wiring area 5 so as to equally increase adjacent wire existence probabilities of the wires existing in the wiring area 5 to a fixed adjacent wire existence probability, and a circuit layout of the wiring area 5 is assumed on condition that the fill-metal is inserted in the wiring area 5 (dummy wiring assuming step of a step ST2-1).

For example, it is assumed that wires having the same wire width are arranged in the wiring area 5 in equal intervals, the wire existence probability in the wiring area 5 is set to 10%, and an adjacent wire existence probability of a designated wire is set to 20%. In cases where it is pre-set in the additional adjacent wire existence probability calculating unit 8a that the wire existence probability of the wiring area 5 is increased to a target wire existence probability pre-set to 40% by inserting fill-metal in the wiring area 5, it is estimated in the additional adjacent wire existence probability calculating unit 8a that the adjacent wire existence probability of the designated wire reaching after the insertion of the fill-metal is, for example, equivalent to 80%. Therefore, a fixed adjacent wire existence probability, to which the adjacent wire existence probabilities of the wires in the wiring area 5 are equally increased, is set to 80% in the additional adjacent wire existence probability calculating unit 8a. Therefore, it is judged in the additional adjacent wire existence probability calculating unit 8a that fill-metal is inserted in the wiring area 5 to equally increase adjacent wire existence probabilities of the wires of the wiring area 5 to the fixed adjacent wire existence probability set to 80%.

In this case, adjacent wire existence probabilities of the wires of the wiring area 5 are increased after the insertion of the fill-metal. However, in cases where a specific wire or a plurality of specific wires, in which each adjacent wire existence probability does not reach the fixed adjacent wire existence probability set to 80% after the insertion of the fill-metal, exist in the wiring area 5, it is assumed that a virtual wire segment of the fill-metal is added to each specific wire so as to make the adjacent wire existence probability of the specific wire reach the fixed adjacent wire existence probability set to 80%, and a circuit layout of the wiring area 5 is assumed on condition that the fill-metal is inserted in the wiring area 5.

Figure 9:
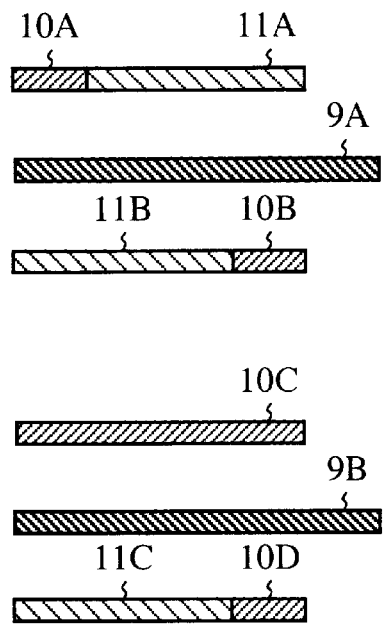
FIG. 9 is a view describing the assumption of a circuit layout of a wiring area performed in the parasitic element extracting apparatus according to the second embodiment on condition that the fill-metal is inserted in the wiring area of the semiconductor circuit.
Figure 10:
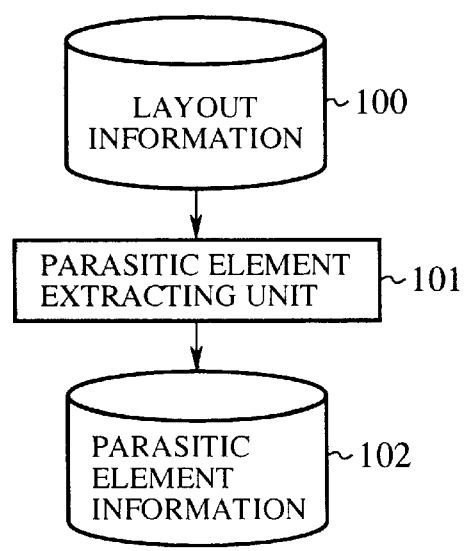
FIG. 10 is a block diagram schematically showing the configuration of a conventional parasitic element extracting apparatus.

The assumption of the circuit layout of the wiring area 5 is described more precisely with reference to FIG. 9.

FIG. 9 is a view describing the assumption of a circuit layout of the wiring area 5 performed in the parasitic element extracting apparatus according to the second embodiment on condition that the fill-metal is inserted in the wiring area 5 of the semiconductor circuit. In FIGS. 9, 9A and 9B indicate a plurality of designated wires which are used to calculate adjacent wire existence probabilities in the wiring area 5. In cases where no fill-metal is inserted in the wiring area 5, the designated wire 9A has an adjacent wire 10A, of which a length is equal to ⅕ of a length of the designated wire 9A, and another adjacent wire 10B of which a length is equal to ⅕ of the length of the designated wire 9A. Therefore, an adjacent wire existence probability of the designated wire 9A is equal to 20%. Also, the designated wire 9B has an adjacent wire 10C, of which a length is equal to ⅘ of a length of the designated wire 9B, and another adjacent wire 10D of which a length is equal to ⅕ of the length of the designated wire 9B. Therefore, an adjacent wire existence probability of the designated wire 9B on the side of the adjacent wire 10C is equal to 80%, and an adjacent wire existence probability of the designated wire 9B on the side of the adjacent wire 10D is equal to 20%. 11A, 11B and 11C indicates virtual wire segments of fill-metal added to the wires 10A to 10C respectively to increase the adjacent wire existence probabilities of the designated wires 9A and 9B by inserting fill-metal in the wiring area 5. The wires 9A, 9B, 10A to 10D and 11A to 11C have the same wire width. Also, the wire 9A, the combination of the wires 10A and 11A and the combination of the wires 10B and 11B are arranged in equal intervals, and the wire 9B, the wire 10C and the combination of the wires 10D and 11C are arranged in the equal intervals.

For example, in the additional adjacent wire existence probability calculating unit 8a, an insertion amount of fill-metal (or an additional amount of dummy wire) depending on the degree of the wire congestion in the wire area 5 is set according to both the wire existence probability of the wire area 5 and the target wire existence probability pre-set in the additional adjacent wire existence probability calculating unit 8a. Thereafter, the adjacent wire existence probabilities of the wires (represented by the designated wires 9A and 9B) of the wiring area 5 are, for example, equally increased to the fixed adjacent wire existence probability of 80% by inserting the fill-metal of which the insertion amount is set in the additional adjacent wire existence probability calculating unit 8a. In this case, as shown in FIG. 9, the virtual wire segment 11A, of which a length is equal to $3/5$ of the length of the designated wire 9A, is added to the adjacent wire 10A as fill-metal, and the virtual wire segment 11B, of which a length is equal to $3/5$ of the length of the designated wire 9A, is added to the adjacent wire 10B as fill-metal. That is, the virtual wire segments 11A and 11B, of which the lengths are three times of the lengths of the adjacent wires 10A and 10B, are added to the adjacent wires 10A and 10B respectively. Therefore, increased lengths of the adjacent wires 10A and 10B obtained by assuming the insertion of the fill-metal respectively reach $4/5$ of the length of the designated wire 9A, and the adjacent wire existence probability of the designated wire 9A is increased to the fixed adjacent wire existence probability of 80%.

Also, as to the designated wire 9B, the virtual wire segment 11C, of which the length is $3/5$ of the length of the designated wire 9B, is added to the designated wire 9B. Therefore, the adjacent wire existence probability of the designated wire 9B on the side of the adjacent wire 10D is increased to 80%. In contrast, the adjacent wire 10C has the length equal to $4/5$ of the length of the designated wire 9B, and the adjacent wire existence probability of the designated wire 9B on the side of the adjacent wire 10C is equal to 80% without adding a virtual wire segment. Therefore, no virtual wire segment is added to the adjacent wire 10C.

Therefore, the circuit layout of the wiring area 5 can be assumed in the additional adjacent wire existence probability calculating unit 8a on condition that the fill-metal is inserted in the wiring area 5.

Thereafter, the parasitic element extracting operation is performed in the parasitic element extracting unit 3 in the same manner as in the first embodiment (step ST-3).

For example, in cases where information of wiring capacitance is extracted as information of a parasitic element, positions of pins in the wiring area 5, routes of wires used to connect the pins with each other and positions of constituent elements (for example, layers and via holes) of the semiconductor circuit are determined in the parasitic element extracting unit 3 according to a layout of the semiconductor circuit including the circuit layout of the wiring area 5 in which the fill-metal is inserted in the step ST2-1. Thereafter, the information of the parasitic capacitance accompanying each constituent element is extracted from a layout of the semiconductor circuit including the circuit layout of the wiring area 5 as information of a parasitic element according to the positional relationship of the constituent elements and the sizes of the constituent elements. In this case, a value of the parasitic capacitance, of which the information is extracted, is higher than that of the parasitic capacitance existing in the semiconductor circuit in which no fill-metal is inserted.

Also, in cases where information of parasitic inductance is extracted as information of a parasitic element, positions of pins in the wiring area 5, routes of wires used to connect the pins with each other and positions of constituent elements (for example, layers and via holes) of the semiconductor circuit are determined in the parasitic element extracting unit 3 according to a layout of the semiconductor circuit including the circuit layout of the wiring area 5 in which the fill-metal is inserted in the step ST2-1. Thereafter, a return bus is assumed, and the information of the parasitic inductance is extracted from a layout of the semiconductor circuit including the circuit layout of the wiring area 5 as information of a parasitic element. In this case, a value of the parasitic inductance, of which the information is extracted, is lower than that of the parasitic inductance existing in the semiconductor circuit in which no fill-metal is inserted.

Thereafter, the information 4 of each parasitic element extracted in the parasitic element extracting unit 3 is related to one constituent element of the semiconductor circuit accompanied by the parasitic element and is output. The parasitic element information 4 is used to determine the performance of the semiconductor circuit which has the layout indicated by the layout information 1. Also, the parasitic element information 4 is used to change the design of the semiconductor circuit so as to reduce an adverse influence of the parasitic elements generated in the semiconductor circuit.

As is described above, in the second embodiment, a wiring area 5 or a plurality of wiring areas 5, on which the insertion of fill-metal is judged, are selected according to the degree of the wire congestion in the wiring area 5 or the degrees of the wire congestion in the wiring areas 5, an insertion amount of fill-metal (or an additional amount of dummy wire) depending on the degree of the wire congestion in each wire area 5, is set according to both the wire existence probability of the wire area 5 and the target wire existence probability pre-set in the additional adjacent wire existence probability calculating unit 8a, and a circuit layout of the wiring area 5, in which the wire existence probability is increased to the target wire existence probability and the adjacent wire existence probabilities of the wires are equally increased to the fixed adjacent wire existence probability, is assumed on condition that the insertion amount of fill-metal is inserted in the wiring area 5. Accordingly, an adverse influence of the fill-metal, which is inserted in the wiring area 5, can be considered in advance according to a simple assumption operation in the design of the integrated circuit.

What is claimed is:

1. A parasitic element extracting apparatus comprising:
   wire congestion calculating means for calculating a degree of wire congestion in a wiring area, which is placed in a layout of a semiconductor circuit, according to both the number of wires arranged in the wiring area and the number of wires possible to be arranged in the wiring area;
   dummy wiring area judging means for pre-setting a reference degree of the wire congestion relating to the arrangement of dummy wire, and comparing the degree of the wire congestion in the wiring area of the semiconductor circuit calculated by the wire congestion calculating means with the reference degree of the wire congestion to judge whether or not dummy wire is arranged in the wiring area for which the degree of the wire congestion is calculated by the wire congestion calculating means;

dummy wiring assuming means for setting an additional amount of the dummy wire according to the degree of the wire congestion in the wiring area of the semiconductor circuit calculated by the wire congestion calculating means in cases where it is judged by the dummy wiring area judging means that the dummy wire is arranged in the wiring area, and assuming a circuit layout of the wiring area on condition that the dummy wire, of which the additional amount is set, is arranged in the wiring area; and parasitic element extracting means for extracting information of a parasitic element of the semiconductor circuit from a layout of the semiconductor circuit in which the circuit layout of the wiring area assumed in the dummy wiring assuming step is included.

2. A parasitic element extracting apparatus according to claim 1, wherein information of wire capacitance and/or inductance is extracted as the information of the parasitic element of the semiconductor circuit by the parasitic element extracting means, a value of the wire capacitance, of which the information is extracted from the layout of the semiconductor circuit, is set by the parasitic element extracting means to be higher than a value of the wire capacitance existing in the wiring area in which no dummy wire is arranged, and a value of the inductance, of which the information is extracted from the layout of the semiconductor circuit, is set by the parasitic element extracting means to be lower than a value of the inductance existing in the wiring area in which no dummy wire is arranged.

3. A parasitic element extracting apparatus according to claim 1, wherein a wire existence probability of the wiring area and a plurality of adjacent wire existence probabilities of wires of the wiring area are calculated by the dummy wiring assuming means according to both a wire existing region and a wiring possible region placed in the wiring area, the additional amount of the dummy wire depending on the degree of the wire congestion in the wiring area is set according to both the wire existence probability of the wiring area and a target wire existence probability of the wiring area pre-set by the dummy wiring assuming means, and the circuit layout of the wiring area is assumed by the dummy wiring assuming means so as to increase the adjacent wire existence probabilities of the wires of the wiring area at equal rates.

4. A parasitic element extracting apparatus according to claim 1, wherein a wire existence probability of the wiring area and a plurality of adjacent wire existence probabilities of wires of the wiring area are calculated by the dummy wiring assuming means according to both a wire existing region and a wiring possible region placed in the wiring area, the additional amount of the dummy wire depending on the degree of the wire congestion in the wiring area is set according to both the wire existence probability of the wiring area and a target wire existence probability of the wiring area pre-set by the dummy wiring assuming means, and the circuit layout of the wiring area is assumed by the dummy wiring assuming means so as to equally increase the adjacent wire existence probabilities of the wires of the wiring area to a fixed adjacent wire existence probability.

5. A parasitic element extracting method comprising:

a wire congestion calculating step for calculating a degree of wire congestion in a wiring area of a semiconductor circuit, according to both the number of wires arranged in the wiring area and the number of wires possible to be arranged in the wiring area;

a dummy wiring area judging step for comparing the degree of the wire congestion calculated in the wire congestion calculating step with a reference degree of the wire congestion relating to the arrangement of dummy wire, and judging whether or not dummy wire is arranged in the wiring area for which the degree of the wire congestion is calculated in the wire congestion calculating step;

a dummy wiring assuming step for setting an additional amount of the dummy wire according to the degree of the wire congestion in the wiring area calculated in the wire congestion calculating step in cases where it is judged in the dummy wiring area judging step that the dummy wire is arranged in the wiring area, and assuming a circuit layout of the wiring area on condition that the dummy wire, of which the additional amount is set, is arranged in the wiring area; and a parasitic element extracting step for extracting information of a parasitic element of the semiconductor circuit from a layout of the semiconductor circuit in which the circuit layout of the wiring area assumed in the dummy wiring assuming step is included.

6. A parasitic element extracting method according to claim 5, wherein information of wire capacitance and/or inductance is extracted as the information of the parasitic element of the semiconductor circuit in the parasitic element extracting step, a value of the wire capacitance, of which the information is extracted from the layout of the semiconductor circuit, is set in the parasitic element extracting step to be higher than a value of the wire capacitance existing in the wiring area in which no dummy wire is arranged, and a value of the inductance, of which the information is extracted from the layout of the semiconductor circuit, is set in the parasitic element extracting step to be lower than a value of the inductance existing in the wiring area in which no dummy wire is arranged.

7. A parasitic element extracting method according to claim 5, wherein a wire existence probability of the wiring area and a plurality of adjacent wire existence probabilities of wires of the wiring area are calculated in the dummy wiring assuming step according to both a wire existing region and a wiring possible region placed in the wiring area, the additional amount of the dummy wire depending on the degree of the wire congestion in the wiring area is set according to both the wire existence probability of the wiring area and a target wire existence probability of the wiring area pre-set in the dummy wiring assuming step, and the circuit layout of the wiring area is assumed in the dummy wiring assuming step so as to increase the adjacent wire existence probabilities of the wires of the wiring area at equal rates.

8. A parasitic element extracting method according to claim 5, wherein a wire existence probability of the wiring area and a plurality of adjacent wire existence probabilities of wires of the wiring area are calculated in the dummy wiring assuming step according to both a wire existing region and a wiring possible region placed in the wiring area, the additional amount of the dummy wire depending on the degree of the wire congestion in the wiring area is set according to both the wire existence probability of the wiring area and a target wire existence probability of the wiring area pre-set in the dummy wiring assuming step, and the circuit layout of the wiring area is assumed in the dummy wiring assuming step so as to equally increase the adjacent wire existence probabilities of the wires of the wiring area to a fixed adjacent wire existence probability.

* * * * *